United States Patent
Hah et al.

(10) Patent No.: US 7,851,125 B2
(45) Date of Patent: Dec. 14, 2010

(54) MASK PATTERN FOR SEMICONDUCTOR DEVICE FABRICATION, METHOD OF FORMING THE SAME, AND METHOD OF FABRICATING FINELY PATTERNED SEMICONDUCTOR DEVICE

(75) Inventors: Jung-Hwan Hah, Hwaseong-si (KR); Jin Hong, Hwaseong-si (KR); Hyun-Woo Kim, Hwaseong-si (KR); Hata Mitsuhiro, Suwon-si (KR); Kolake Mayya Subramanya, Suwon-si (KR); Sang-Gyun Woo, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1540 days.

(21) Appl. No.: 11/186,913

(22) Filed: Jul. 21, 2005

(65) Prior Publication Data

US 2006/0046205 A1    Mar. 2, 2006

(30) Foreign Application Priority Data

Jul. 22, 2004 (KR) .................... 10-2004-0057142

(51) Int. Cl.
*G03F 7/40* (2006.01)
*G03F 7/36* (2006.01)
*G03F 7/20* (2006.01)
*G03F 7/30* (2006.01)
*G03F 7/039* (2006.01)

(52) U.S. Cl. .............. 430/270.1; 430/311; 430/313; 430/317; 430/330; 430/5; 430/9; 430/14; 430/15; 430/18

(58) Field of Classification Search ............ None
See application file for complete search history.

(56) References Cited

U.S. PATENT DOCUMENTS 6,015,761 A * 1/2000 Merry et al. .............. 438/727

(Continued)

FOREIGN PATENT DOCUMENTS

CN    1488995    4/2001

(Continued)

OTHER PUBLICATIONS

Chinese Office Action dated Apr. 10, 2009 in corresponding Chinese Appln. No. 2005100874497.

*Primary Examiner*—Sin J. Lee
(74) *Attorney, Agent, or Firm*—F. Chau & Associates, LLC

(57) ABSTRACT

Provided are a mask pattern including a silicon-containing self-assembled molecular layer, a method of forming the same, and a method of fabricating a semiconductor device. The mask pattern includes a resist pattern formed on a semiconductor substrate and the self-assembled molecular layer formed on the resist pattern. The self-assembled molecular layer has a silica network formed by a sol-gel reaction. To form the mask pattern, first, the resist pattern is formed with openings on an underlayer covering the substrate to expose the underlayer to a first width. Then, the self-assembled molecular layer is selectively formed only on a surface of the resist pattern to expose the underlayer to a second width smaller than the first width. The underlayer is etched by using the resist pattern and the self-assembled molecular layer as an etching mask to obtain a fine pattern.

17 Claims, 8 Drawing Sheets

U.S. PATENT DOCUMENTS

| | | | |
|---|---|---|---|
| 7,524,408 B2 * | 4/2009 | Monbouquette et al. | 204/486 |
| 7,571,529 B2 * | 8/2009 | Sirringhaus et al. | 29/417 |
| 2003/0082488 A1 | 5/2003 | Rottstegge et al. | |
| 2004/0009436 A1 | 1/2004 | Lee et al. | |
| 2005/0227492 A1 * | 10/2005 | Hah et al. | 438/696 |
| 2006/0084277 A1 * | 4/2006 | Nakashima et al. | 438/758 |

FOREIGN PATENT DOCUMENTS

| | | |
|---|---|---|
| CN | 1407116 | 4/2003 |
| JP | 2004-37570 | 2/2004 |
| KR | 10-2001-0037049 | 5/2001 |
| KR | 10-2003-0049198 A | 6/2003 |
| KR | 10-2004-0015955 | 2/2004 |

\* cited by examiner

MASK PATTERN FOR SEMICONDUCTOR DEVICE FABRICATION, METHOD OF FORMING THE SAME, AND METHOD OF FABRICATING FINELY PATTERNED SEMICONDUCTOR DEVICE

CROSS-REFERENCE TO RELATED APPLICATION

This application claims priority from Korean Patent Application No. 10-2004-0057142, filed on Jul. 22, 2004, in the Korean Intellectual Property Office, the disclosure of which is incorporated by reference herein.

BACKGROUND OF THE INVENTION

1. Field of the Invention

The present invention relates to semiconductor device fabrication. More particularly, the present invention relates to a mask pattern for fabrication of a semiconductor device with a fine pattern above the wavelength limit of lithography, a method of forming the same, and a method of fabricating a finely patterned semiconductor device using the mask pattern as an etching mask.

2. Description of the Related Art

In a conventional semiconductor device fabrication patterning process, a photoresist pattern is formed on a predetermined film, for example, a silicon film, a dielectric film, or a conductive film. Then the predetermined film is etched by using the photoresist pattern as an etching mask to form a desired pattern.

With the trend towards increasing integration of semiconductor devices, the industry has established certain design criteria for smaller critical dimension (CD) and a new lithography technology for forming fine patterns including contact holes having a smaller opening size or spaces having a smaller width.

In a conventional lithography technology for forming smaller-sized contact holes, a short-wavelength exposure tool, like in E-beam lithography, or a half-tone phase shift mask is used. The short-wavelength exposure tool based lithography has many difficulties because it is material-dependent and uneconomical. The half-tone phase shift mask based lithography has limitations on mask formation technology and resolution, and thus, it is very difficult to form contact holes which are less than 150 nm in size.

Hitherto, various technologies for satisfying the need of a smaller feature size have been suggested.

For example, Japanese Patent Laid-Open Publication No. 1989-307228 discloses a technology of forming a fine resist pattern by exposure and development of a resist film and then thermally treating the resist pattern so that the profile shape of the resist pattern is changed. According to this technology, however, a resist flow rate is different in the upper area from the middle area of the resist pattern. In particular, when the CD of the resist pattern to be reduced by thermal flow is 100 nm or more, the profile of the resist pattern is transformed by rapid flow characteristics of the resist film. As a result, a bowing profile in which a swelling phenomenon takes place near the middle area. Therefore, this technology has a limitation in adjusting the flow rate of the resist pattern, which makes it difficult to reduce the CD of the resist pattern while maintaining a vertical profile shape.

Japanese Patent Laid-Open Publication No. 1995-45510 discloses a method of forming a fine pattern, which includes: forming a resist pattern and coating a resin immiscible with a resist on the entire or partial surface of the resist pattern, followed by thermal treatment to flow the resist. According to this method, excessive flow can be prevented since the thermal flow of the resist is generated after the resin coating. However, polyvinylalcohol used as the resin has a high viscosity and is water-insoluble, and thus, it is difficult to completely remove the resin by rinsing with deionized water.

Japanese Patent Laid-Open Publication No. 2001-228616 discloses a method of decreasing both the hole diameter and the isolation width of a resist pattern by increasing the thickness of the resist pattern. According to this technology, the resist pattern that can serve as an acid donor is coated with a framing material that can serve as an acid acceptor for crosslinkage with the acid. When the acid is transferred from the resist pattern to a layer made of the framing material by heating, a crosslinked layer is formed as a layer covering the resist pattern at an interface between the resist pattern and the framing material layer. However, a chemical crosslinking reaction may also occur at an unwanted position, thereby causing pattern defects.

Japanese Patent Laid-Open Publication No. 2003-202679 discloses a method of forming fine patterns using a coating agent. The coating agent is coated on a substrate having photoresist patterns to decrease spacing between the photoresist patterns by the thermal shrinkage effect of the coating agent. However, since the amount of thermal shrinkage in the coating agent depends on the temperature profile of the substrate, it is difficult to form uniform resist patterns on the entire substrate surface.

As described above, in CD reduction technologies that have been suggested hitherto, crosslinkage takes place between a photoresist and an organic polymer and a thermal treatment for resist flow. However, these methods have a disadvantage in that a resist pattern has a low resistance to dry etching. With respect to a CD reduction technology based on a crosslinkage between a photoresist and an organic polymer, a crosslinked layer coated on the surface of a resist pattern is mainly made of a hydrocarbon compound, which has a low dry etching resistance, relative to a photoresist material. On the other hand, with respect to a CD reduction technology based on a thermal treatment for resist flow, the thickness of a resist pattern made of a photoresist material decreases during thermal flow of the photoresist material, thereby lowering a resistance to dry etching.

A way to increase dry etching resistance of a resist pattern is to use a silicon-containing material. U.S. Pat. No. 6,110,637 discloses a method of forming a fine pattern by crosslinkage between a photoresist with a carboxylic acid anhydride functional group and an aminosiloxane oligomer. However, this method has disadvantages in that a specific photoresist material crosslinkable with aminosiloxane is needed and, separately, an organic solvent is required for removing the unreacted silicon-containing material that remained after the crosslinkage.

U.S. patent application Laid-Open Publication No. 2004/0009436 A1 discloses a method of coating a silicon-containing material layer on a resist pattern by crosslinking a silicon-containing water-soluble polymer with the resist pattern. However, the silicon content is restricted, and thus, it is difficult to obtain sufficient resistance to dry etching.

SUMMARY OF THE INVENTION

The present invention provides a mask pattern for semiconductor device fabrication, which can provide sufficient resistance to dry etching by forming a fine pattern above the wavelength limit of lithography.

The present invention also provides a method of forming a mask pattern for semiconductor device fabrication, which can provide a fine pattern with a smaller feature size while maintaining a sufficient resistance to dry etching.

The present invention also provides a method of fabricating a semiconductor device, which can provide a fine pattern above the wavelength limit of lithography while maintaining a sufficient resistance to dry etching.

According to an aspect of the present invention, there is provided a mask pattern for semiconductor device fabrication, which includes a resist pattern formed on a semiconductor substrate and a silicon-containing self-assembled molecular layer formed on the resist pattern. The self-assembled molecular layer may have a silica network.

The self-assembled molecular layer may include a sol-gel product comprising at least one compound selected from a cationic silicate oligomer and an anionic silicate oligomer.

The cationic silicate oligomer may be a hydrolyzed product of at least one compound selected from aminopropyltrimethoxysilane, aminopropyltriethoxysilane, and amino group-containing polyhedral oligomeric silsesquioxane. The anionic silicate oligomer may be a hydrolyzed product of at least one compound selected from silica, tetraethyl orthosilicate, and monoalkyl-trialkoxy silicon.

The self-assembled molecular layer may further include at least one polymer selected from a cationic polymer and an anionic polymer.

The cationic polymer may be at least one compound selected from the group consisting of polyethyleneimine derivatives, polyallylamine derivatives, poly(diallyldimethylammonium chloride) derivatives, amino group-containing cellulose, cationized cellulose, poly(acrylamide), polyvinylpyridine, and poly(choline acrylate). The anionic polymer may be at least one compound selected from the group consisting of poly(acrylic acid), polystyrenesulfonate, carboxyl group-containing cellulose, anionized cellulose, poly(sulfonalkyl acrylate), poly(acrylamido alkyl sulfonate), and poly(vinyl sulfate).

The self-assembled molecular layer may be a single layer made of a sol-gel product of a cationic silicate oligomer. The self-assembled molecular layer may have a stacked structure of a first self-assembled molecular monolayer made of a sol-gel product of a cationic silicate oligomer and a second self-assembled molecular monolayer made of a compound selected from a sol-gel product of an anionic silicate oligomer and an anionic polymer. The self-assembled molecular layer may have a stacked structure obtained by alternately and repeatedly stacking the first self-assembled molecular monolayer and the second self-assembled molecular monolayer.

The self-assembled molecular layer may have a stacked structure of a first self-assembled molecular monolayer made of one compound selected from a sol-gel product of a cationic silicate oligomer and a cationic polymer, and a second self-assembled molecular monolayer made of a sol-gel product of an anionic silicate oligomer. The self-assembled molecular layer may have a stacked structure obtained by alternately and repeatedly stacking the first self-assembled molecular monolayer and the second self-assembled molecular monolayer.

According to another aspect of the present invention, there is provided a method of forming a mask pattern for semiconductor device fabrication, which includes forming, on an underlayer covering a substrate, a resist pattern with openings through which the underlayer is exposed and forming a silicon-containing self-assembled molecular layer on a surface of the resist pattern.

To form the self-assembled molecular layer, a sol-gel reaction may be induced in a state wherein an aqueous silicate oligomer solution is contacted with the surface of the resist pattern. The sol-gel reaction may be induced by baking the substrate at a temperature of from about 100 to about 180° C. in a state wherein the aqueous silicate oligomer solution is contacted with the surface of the resist pattern.

The operation of forming the self-assembled molecular layer may include contacting the aqueous silicate oligomer solution with the surface of the resist pattern to form a first self-assembled molecular monolayer and contacting a polymer electrolyte solution with the resist pattern to form a second self-assembled molecular monolayer. The aqueous silicate oligomer solution may be an aqueous cationic silicate oligomer solution or an aqueous anionic silicate oligomer solution. The polymer electrolyte solution may be a cationic polymer electrolyte solution or an anionic polymer electrolyte solution.

The operation of forming the self-assembled molecular layer may include contacting an aqueous cationic silicate oligomer solution with the surface of the resist pattern. The operation of forming the self-assembled molecular layer may further include contacting an aqueous anionic silicate oligomer solution or an anionic polymer electrolyte solution with the resist pattern that has been contacted with the aqueous cationic silicate oligomer solution.

The operation of forming the self-assembled molecular layer may include contacting a cationic polymer electrolyte solution with the surface of the resist pattern and then contacting an aqueous anionic silicate oligomer solution with the resist pattern that has been contacted with the cationic polymer electrolyte solution.

In some cases, the method may further include at least one of rinsing the first self-assembled molecular monolayer with a cleaning solution and rinsing the second self-assembled molecular monolayer with the cleaning solution. The cleaning solution may be deionized water.

According to still another aspect of the present invention, there is provided a method of fabricating a semiconductor device, which includes: forming an underlayer on a semiconductor substrate, forming a resist pattern with openings through which the underlayer is exposed to a first width, selectively forming a silicon-containing self-assembled molecular layer only on a surface of the resist pattern to expose the underlayer through the openings to a second width which is smaller than the first width, and etching the underlayer by using the resist pattern and the self-assembled molecular layer as an etching mask.

According to the present invention, a silicon-containing self-assembled molecular layer is formed on a resist pattern to obtain a mask pattern with microdimensional openings above the wavelength limit established by photolithography. As a result, the vertical sidewall profile of the mask pattern can remain unchanged. Furthermore, the CD of the openings can be reduced by a simple method at room temperature to ensure a simple and inexpensive process. Still furthermore, an underlayer is etched using a silicon-containing self-assembled molecular layer as a mask pattern to ensure a resistance to dry etching.

BRIEF DESCRIPTION OF THE DRAWINGS

The present invention will become more apparent by describing in detail exemplary embodiments thereof with reference to the attached drawings in which.

DETAILED DESCRIPTION OF THE PREFERRED EMBODIMENTS

The present invention may be embodied in many different forms and should not be construed as being limited to embodiments set forth herein. Rather, these embodiments are provided so that this disclosure will be thorough and complete, and will fully convey the scope of the invention to those skilled in the art. In the accompanying drawings, sizes or thicknesses of films or regions have been exaggerated for clarity of the specification.

Figure 1:
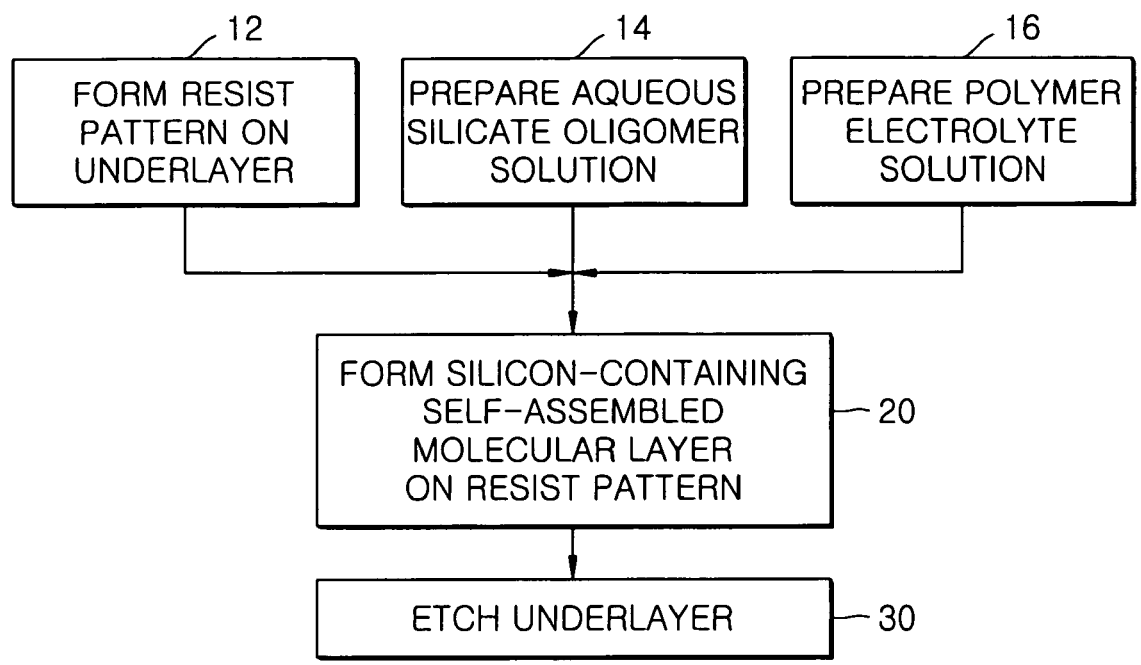
FIG. 1 is a flowchart that schematically illustrates a method of fabricating a semiconductor device according to an exemplary embodiment of the present invention.

A method of fabricating a semiconductor device according to an exemplary embodiment of the present invention will now be described with reference to a flowchart as illustrated in FIG. 1.

Operation 12

In operation 12, first, an underlayer to be etched is formed on a semiconductor substrate. The underlayer may be made of any film material, for example, a dielectric film such as a silicon film, an oxide film, a nitride film, an oxide-nitride film, or a conductive film. To form contact holes in the underlayer, the underlayer is formed as a dielectric film. To perform a patterning process using bi-layer resist (BLR) technology, a bottom layer resist film may be formed as the underlayer. In addition, to perform a patterning process using multi-layer resist (MLR) technology, the underlayer may be composed of the bottom layer resist film and an interlayer oxide film.

Next, a resist film is formed on the underlayer. The resist film is subjected to exposure and development by conventional photolithography to obtain a resist pattern formed with openings through which the underlayer is exposed to a predetermined width.

To form the resist pattern, an acid generated in the resist film during the exposure is diffused by a post-exposure bake process. To form a positive resist film, the diffused acid causes a deprotection reaction by which protecting groups are removed from protected polymers in exposed areas of the resist film, thereby selectively developing the exposed areas. On the other hand, to form a negative resist film, the diffused acid causes polymer crosslinkage in the exposed areas, thereby selectively developing unexposed areas. During the post-exposure bake process, a small amount of acid remains in the boundaries between the exposed areas and the unexposed areas of the resist film. As a result, after development, the boundaries between the exposed areas and the unexposed areas of the resist film, i.e., sidewalls of the resist pattern, are negatively charged by local polymer deprotection by the residual acid. That is, since polymers present at the boundaries between the exposed areas and the unexposed areas are partially deprotected by the residual acid but some deprotected polymers remain undissolved during the development, the sidewalls of the resist pattern are slightly negatively charged. This phenomenon takes place in most resists used in the pertinent art or commercially available regardless of the components of the resists or the type of exposure tools.

Operation 14

In operation 14, an aqueous silicate oligomer solution is prepared. As the aqueous silicate oligomer solution, there may be prepared one or both of the aqueous cationic silicate oligomer solution and the aqueous anionic silicate oligomer solution.

Aqueous Cationic Silicate Oligomer Solution

The aqueous cationic silicate oligomer solution includes a cationic silicate oligomer. The cationic silicate oligomer is a hydrolyzed product of at least one compound selected from aminopropyltrimethoxysilane, aminopropyltriethoxysilane, and amino group-containing polyhedral oligomeric silsesquioxane. The aqueous cationic silicate oligomer solution can be obtained by dissolving a cationic silicate in deionized water in an amount of about 10 ppm to about 10 wt % followed by hydrolysis with a base.

The cationic silicate oligomer is obtained by hydrolyzing at least one of the above-illustrated silicates with the base such as ammonium hydroxide or alkylammonium hydroxide.

An example of a hydrolyzed product of cationic silicate used as the cationic silicate oligomer is represented by Formula 1 below:

[Formula 1]

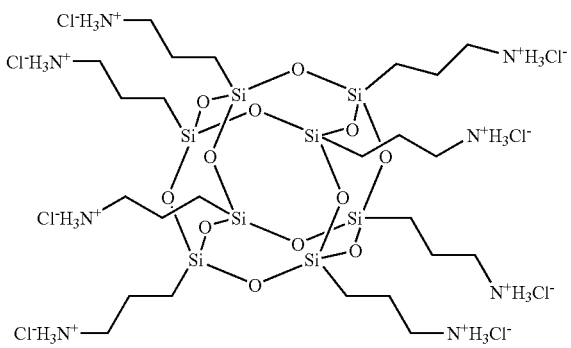

Aqueous Anionic Silicate Oligomer Solution

The aqueous anionic silicate oligomer solution includes an anionic silicate oligomer. The anionic silicate oligomer is a hydrolyzed product of at least one compound selected from silica, tetraethyl orthosilicate, and monoalkyl-trialkoxy silicon. The aqueous anionic silicate oligomer solution may be obtained by dissolving an anionic silicate in deionized water in an amount of from about 10 ppm to about 10 wt % followed by hydrolysis with a base.

The anionic silicate oligomer is obtained by hydrolyzing at least one of the above-illustrated silicates with a base, such as ammonium hydroxide or alkylammonium hydroxide.

An example of a hydrolyzed product of anionic silicate used as the anionic silicate oligomer may be tetramethyl ammonium silicate (TMAH2SiO$_2$).

Operation 16

In operation 16, a polymer electrolyte solution is prepared. As the polymer electrolyte solution, there may be prepared one or both of the cationic polymer electrolyte solution and the anionic polymer electrolyte solution.

Cationic Polymer Electrolyte Solution

The cationic polymer electrolyte solution may be obtained by dissolving, for example, at least one cationic polymer selected from the group consisting of polyethyleneimine derivatives, polyallylamine derivatives, poly(diallyldimethylammonium chloride) derivatives, amino group-containing cellulose, cationized cellulose, poly(acrylamide), polyvinylpyridine, and poly(choline acrylate) in a solvent in an amount of about 10 ppm to about 10 wt %, based on the total weight of the solvent.

Representative examples of the cationic polymer which is suitable to be used herein are represented by Formulae 2 through 5:

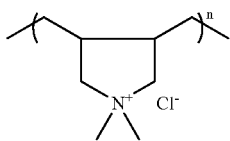

[Formula 2]

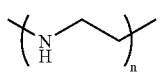

[Formula 3]

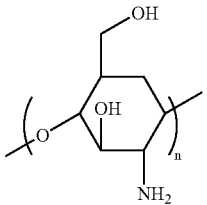

[Formula 4]

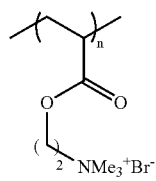

[Formula 5]

Anionic Polymer Electrolyte Solution

The anionic polymer electrolyte solution may be obtained by dissolving, for example, at least one anionic polymer selected from the group consisting of poly(acrylic acid), polystyrenesulfonate, carboxyl group-containing cellulose, anionized cellulose, poly(sulfonalkyl acrylate), poly(acrylamido alkyl sulfonate), and poly(vinyl sulfate) in a solvent in an amount from about 10 ppm to about 10 wt %, based on the total weight of the solvent.

Representative examples of the anionic polymer which is suitable to be used herein are represented by Formulae 6 through 9:

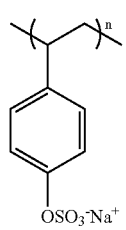

[Formula 6]

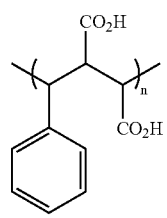

[Formula 7]

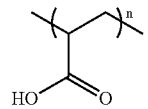

[Formula 8]

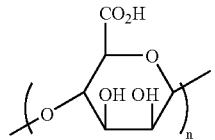

[Formula 9]

Solvent

The solvent may be deionized water, an organic solvent, or a mixture thereof. The organic solvent that is suitable to be used herein as the solvent may be selected from alcohols, amines, ethers, esters, carboxylic acids, thiols, thioesters, aldehydes, ketones, phenols, alkanes, alkenes, arenes, and arylenes.

pH Modifier

The polymer electrolyte solution may include a pH modifier to maintain the polymer electrolyte solution at an appropriate pH. The pH of the polymer electrolyte solution suitable herein varies according to the types of main components contained in the polymer electrolyte solution. In this respect, an appropriate pH is selected according to components contained in the polymer electrolyte solution. The pH modifier may be an acidic or basic material. For example, the pH modifier may be selected from quaternary ammonium salts, alkylamines, alkoxyamines, sulfides, thiols, phosphines, phosphites, sulfonic acids, phosphoric acids, carboxylic acids, fluorine-containing acids, and hydrogen halides.

Since there is no particular limitation on the execution sequence of operations 12, 14, and 16, one of the three operations can be preferentially carried out over others according to a process design.

Operation 20

In operation 20, a silicon-containing self-assembled molecular layer is formed on the surface of the resist pattern. A detailed description of the operation for forming the silicon-containing self-assembled molecular layer will be provided later.

Operation 30

In operation 30, the underlayer is dry-etched using the resist pattern and the silicon-containing self-assembled molecular layer as an etching mask. As a result, a fine pattern above the wavelength limit of lithography can be obtained.

Figure 2:
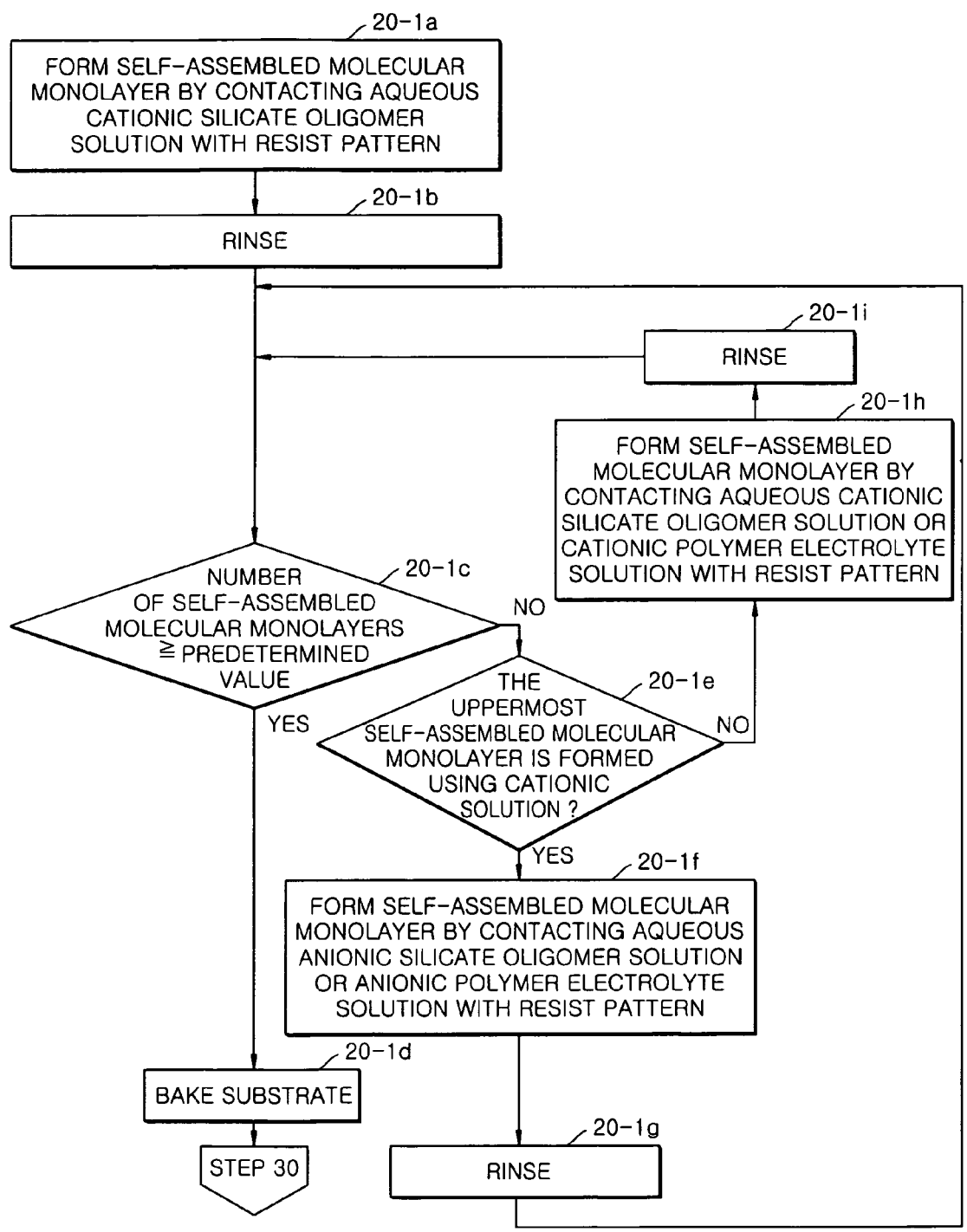
FIG. 2 is a flowchart that illustrates the first example of an operation of forming a silicon-containing self-assembled molecular layer on a surface of a resist pattern in a method of fabricating a semiconductor device according to an exemplary embodiment of the present invention.

FIG. 2 is a flowchart that illustrates a first example for forming a silicon-containing self-assembled molecular layer on the surface of a resist pattern according to operation 20 in the semiconductor device fabrication method according to an embodiment of the present invention described with reference to FIG. 1.

Operation 20-1*a*

In operation 20-1*a*, an aqueous cationic silicate oligomer solution is contacted with the surface of a resist pattern so that a sol-gel reaction occurs at the surface of the resist pattern, to thereby form a self-assembled molecular monolayer. Contacting is performed at a temperature of about 10 to about 30° C., and preferably room temperature. At this time, the sol-gel reaction may occur even when the aqueous cationic silicate oligomer solution is simply contacted with a partial or entire surface of the resist pattern.

To contact the aqueous cationic silicate oligomer solution with the surface of the resist pattern, various methods such as spin coating, puddling, dipping, or spraying may be used. For example, the time required for contacting may be set to any time between from about 10 seconds to about 5 minutes. To contact the surface of the resist pattern with the aqueous cationic silicate oligomer solution, a semiconductor substrate may be rotated or fixed according to the contact method. For example, in spin coating, the semiconductor substrate is rotated about its center at a predetermined speed. In puddling or spraying, the semiconductor substrate is fixed without moving or rotating.

As described in operation 12 of FIG. 1, due to polymers that are partially deprotected by an acid but remain undissolved during development, the sidewalls of the resist pattern are slightly negatively charged. In this respect, when the aqueous cationic silicate oligomer solution is directly contacted with the surface of the resist pattern, a cationic silicate oligomer is selectively attached to only the surface of the resist pattern in a self-assembled manner. As a result, a self-assembled molecular monolayer made of the cationic silicate oligomer is formed on the surface of the resist pattern.

Operation 20-1*b*

The resultant structure containing the self-assembled molecular monolayer is rinsed with a cleaning solution. Preferably, the cleaning solution is deionized water. The rinsing is optional, and thus, may be omitted as needed.

Operation 20-1*c*

When the number of self-assembled molecular monolayers formed on the surface of the resist pattern reaches a predetermined value, operation 20-1*d* proceeds. Otherwise, operation 20-1*e* proceeds.

Operation 20-1*d*

The semiconductor substrate in which a desired number of the self-assembled molecular monolayers are formed on the surface of the resist pattern is baked at a temperature of from about 100 to about 180° C. to complete the sol-gel reaction on the surface of the resist pattern prior to operation 30 of FIG. 1.

Operation 20-1*e*

To form more self-assembled molecular monolayers on the surface of the resist pattern, first, whether the uppermost self-assembled molecular monolayer formed on the resist pattern is formed using a cationic or anionic solution is determined. When the uppermost self-assembled molecular monolayer formed on the resist pattern is formed using a cationic solution, operation 20-1*f* proceeds. On the other hand, when it is formed using an anionic solution, operation 20-1*h* proceeds.

Operation 20-1*f*

As a result of operation 20-1*e*, when the uppermost self-assembled molecular monolayer formed on the resist pattern is formed using a cationic solution, the resist pattern is contacted with an aqueous anionic silicate oligomer solution or an anionic polymer electrolyte solution to form an anionic self-assembled molecular monolayer. The detailed description described above with reference to operation 20-1*a* can be applied to the contacting of the anionic solution with the resist pattern.

Operation 20-1*g*

The resultant structure including the self-assembled molecular monolayer formed using the anionic solution is rinsed with a cleaning solution. Preferably, the cleaning solution is deionized water. The rinsing is optional, and thus, may be omitted. Then, operation 20-1*c* again proceeds to determine whether the number of self-assembled molecular monolayers formed on the surface of the resist pattern reaches a predetermined value.

Operation 20-1*h*

As a result of operation 20-1*e*, when the uppermost self-assembled molecular monolayer formed on the resist pattern is formed using an anionic solution, the resist pattern is contacted with an aqueous cationic silicate oligomer solution or a cationic polymer electrolyte solution to form a cationic self-assembled molecular monolayer. The detailed description described above with reference to operation 20-1*a* can be applied to the contacting of the cationic solution with the resist pattern.

Operation 20-1*i*

The resultant structure including the self-assembled molecular monolayer formed using the cationic solution is rinsed with a cleaning solution. Preferably, the cleaning solution is deionized water. The rinsing is optional, and thus, may be omitted. Then, operation 20-1*c* again proceeds to determine whether the number of self-assembled molecular monolayers formed on the surface of the resist pattern reaches a predetermined value.

Figure 3:
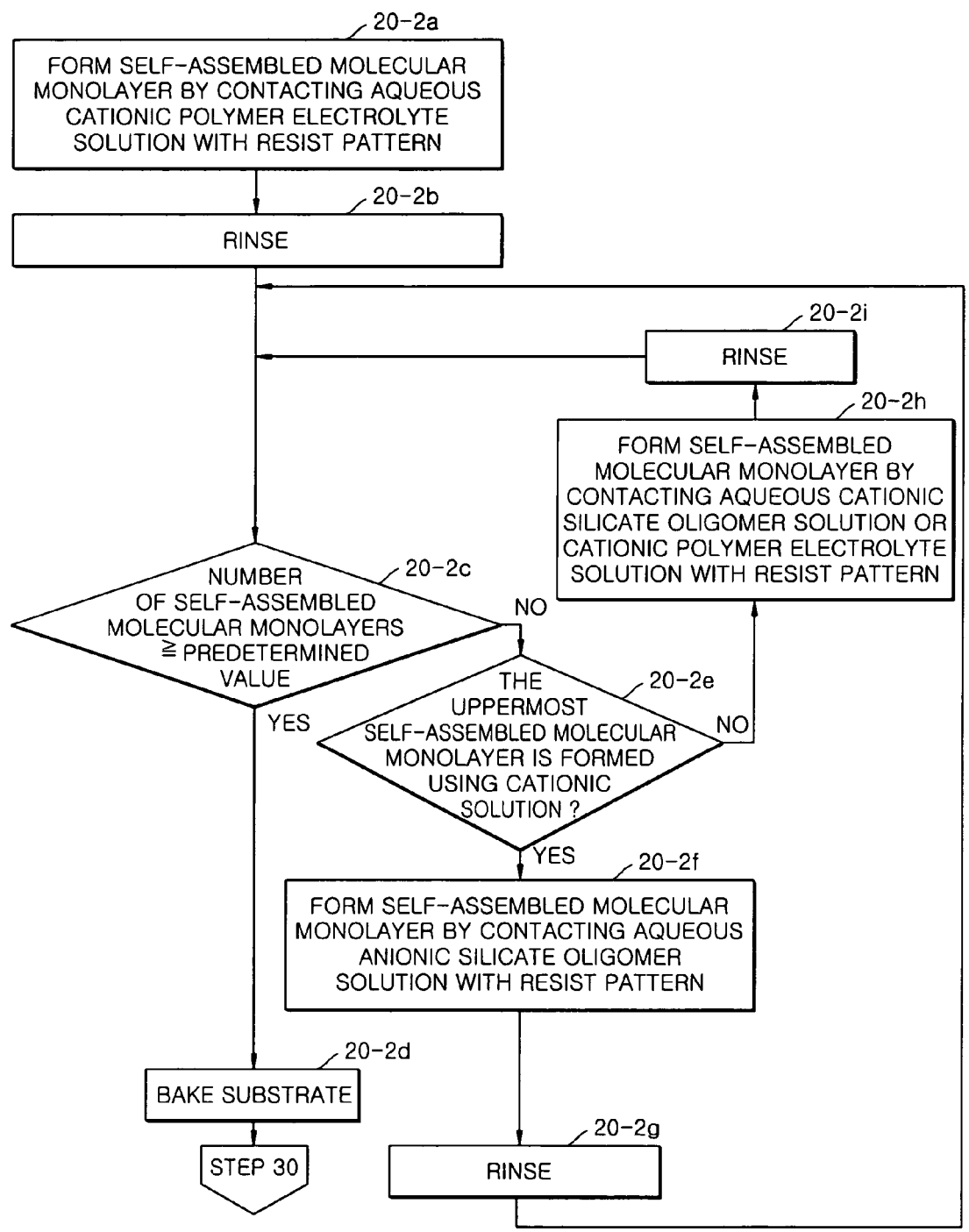
FIG. 3 is a flowchart that illustrates the second example of an operation of forming a silicon-containing self-assembled molecular layer on a surface of a resist pattern in a method of fabricating a semiconductor device according to an exemplary embodiment of the present invention.

FIG. 3 is a flowchart that illustrates a second example for forming a silicon-containing self-assembled molecular layer on a surface of a resist pattern according to operation 20 in the semiconductor device fabrication method according to an embodiment of the present invention described with reference to FIG. 1.

Operation 20-2*a*

In operation 20-2*a*, a cationic polymer electrolyte solution is contacted with a surface of a resist pattern so that a sol-gel reaction occurs at the surface of the resist pattern, to thereby form a self-assembled molecular monolayer. The contacting is performed at a temperature of from about 10 to about 30° C., and preferably room temperature.

To contact the cationic polymer electrolyte solution with the surface of the resist pattern, various methods such as spin coating, puddling, dipping, or spraying may be used. For example, the time required for the contacting may be set to any time between about 10 seconds and about 5 minutes. When contacting the surface of the resist pattern with the cationic polymer electrolyte solution, a semiconductor substrate may be rotated or fixed according to a contact method. For example, in spin coating, the semiconductor substrate is rotated about its center at a predetermined speed. In puddling or spraying, the semiconductor substrate is fixed without moving or rotating.

As described in operation 12 of FIG. 1, due to polymers that are partially deprotected by an acid but remain undissolved during development, the sidewalls of the resist pattern are slightly negatively charged. In this respect, when the cationic polymer electrolyte solution is directly contacted with the surface of the resist pattern, the cationic polymer is selectively attached only to the surface of the resist pattern in a self-assembled manner. As a result, a self-assembled molecular monolayer made of the cationic polymer is formed on the surface of the resist pattern.

Operation 20-2*b*

The resultant structure containing the self-assembled molecular monolayer is rinsed with a cleaning solution. Preferably, the cleaning solution is deionized water. The rinsing is optional, and thus, may be omitted.

Operation 20-2c

When the number of self-assembled molecular monolayers formed on the surface of the resist pattern reaches a predetermined value, operation 20-2d proceeds. Otherwise, operation 20-2e proceeds.

Operation 20-2d

The semiconductor substrate in which a desired number of self-assembled molecular monolayers are formed on the surface of the resist pattern is baked at a temperature of from about 100 to about 180° C. The baking is optional, and thus, may be omitted as needed. Then, operation 30 of FIG. 1 proceeds.

Operation 20-2e

To form more self-assembled molecular monolayers on the surface of the resist pattern, first, determine whether the uppermost self-assembled molecular monolayer formed on the resist pattern is formed using a cationic or anionic solution. When the uppermost self-assembled molecular monolayer formed on the resist pattern is formed using a cationic solution, operation 20-2f proceeds. On the other hand, when it is formed using an anionic solution, operation 20-2h proceeds.

Operation 20-2f

As a determination result of operation 20-2e, when the uppermost self-assembled molecular monolayer formed on the resist pattern is formed using a cationic solution, the resist pattern is contacted with an anionic silicate oligomer solution to form an anionic self-assembled molecular monolayer. Here, if an aqueous anionic silicate oligomer solution contacts the surface of the resist pattern, an anionic polymer electrolyte solution may also be used in this operation in order to contact with the resist pattern. At this time, even when the aqueous anionic silicate oligomer solution is simply contacted with a portion of the or the entire outermost surface of the resist pattern, a sol-gel reaction may occur between the aqueous anionic silicate oligomer solution and the outermost surface of the resist pattern. The detailed description described above with reference to operation 20-2a can be applied to contacting of anionic solution with the resist pattern.

Operation 20-2g

The resultant structure including the self-assembled molecular monolayer formed using the anionic solution is rinsed with a cleaning solution. Preferably, the cleaning solution is deionized water. The rinsing is optional, and thus, may be omitted. Then, operation 20-2c again proceeds to determine whether the number of self-assembled molecular monolayers formed on the surface of the resist pattern reaches a predetermined value.

Operation 20-2h

As a result of operation 20-2e, when the uppermost self-assembled molecular monolayer formed on the resist pattern is formed using an anionic solution, the resist pattern is contacted with an aqueous cationic silicate oligomer solution or a cationic polymer electrolyte solution to form a cationic self-assembled molecular monolayer. The detailed description described above with reference to operation 20-1a can be applied to contacting the cationic solution with the resist pattern.

Operation 20-2i

The resultant structure including the self-assembled molecular monolayer formed using the cationic solution is rinsed with a cleaning solution. Preferably, the cleaning solution is deionized water. The rinsing is optional, and thus, may be omitted. Then, operation 20-2c again proceeds to determine whether the number of self-assembled molecular monolayers formed on the surface of the resist pattern reaches a predetermined value.

The successive operations for forming the self-assembled molecular monolayers on the surface of the resist pattern as described above with reference to FIGS. 2 and 3 are repeated several times until a self-assembled molecular layer with a desired thickness is formed on the resist pattern. As a result, on the surface of the resist pattern, there is formed an alternately stacked structure of a cationic self-assembled molecular monolayer and an anionic self-assembled molecular monolayer. After a self-assembled molecular layer composed of a plurality of self-assembled molecular monolayers is completed, the exposed areas of an underlayer have a smaller width, as compared to those of the underlayer defined by the resist pattern.

FIGS. 4A through 4D are sequential sectional views that illustrate a method of forming a mask pattern for semiconductor device fabrication according to an exemplary embodiment of the present invention.

Figure 4A:
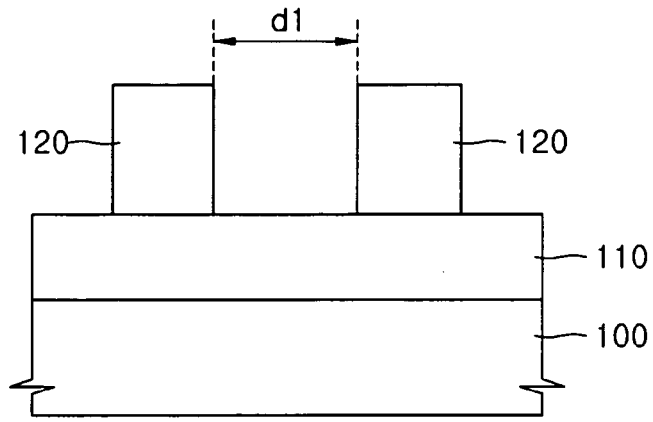
FIGS. 4A through 4D are sequential sectional views that illustrate a method of forming a mask pattern for semiconductor device fabrication according to an exemplary embodiment of the present invention.

In FIG. 4A, a resist pattern 120 is formed on an underlayer 110 covering a substrate 100, for example a semiconductor substrate such as a silicon substrate. The resist pattern 120 is formed with openings through which an upper surface of the underlayer 110 is exposed to a first width d1. The resist pattern 120 may be formed with a plurality of openings defining a hole pattern or a plurality of lines defining a line and space pattern. When the resist pattern 120 is formed with a plurality of lines, the first width d1 corresponds to the width of each space between the lines.

Here, the resist pattern 120 may be made of a resist material for G-line, i-line, DUV, ArF, E-beam, or X-ray. For example, the resist pattern 120 may be made of a resist material containing a Novolak resin and a diazonaphthoquinone (DNQ)-based compound. The resist pattern 120 may also be formed using a common chemical-amplification type resist composition containing a photo-acid generator (PAG). For example, the resist pattern 120 may be formed using a resist composition for KrF excimer laser (248 nm), ArF excimer laser (193 nm), or $F_2$ excimer laser (157 nm). The resist pattern 120 may also be formed using a positive-type resist composition or a negative-type resist composition.

Figure 4B:
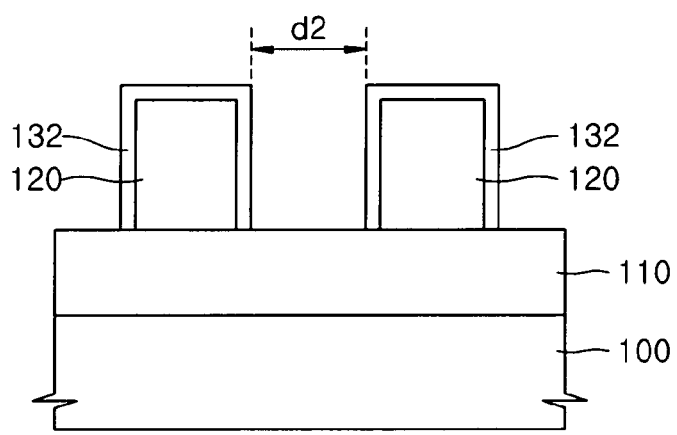

In FIG. 4B, as described above with respect to operation 20-1a of FIG. 2 or operation 20-2a of FIG. 3, an aqueous cationic silicate oligomer solution or a cationic polymer electrolyte solution containing a cationic polymer is contacted with the surface of the resist pattern 120 to form a first self-assembled molecular monolayer 132. By the first self-assembled molecular monolayer 132, an upper surface of the underlayer 110 is exposed to a second width d2, which is smaller than the first width d1. As previously described with reference to FIGS. 1 through 3, a small amount of a negative charge is present on a sidewall surface of the resist pattern 120, and in some cases, on an upper surface of the resist pattern 120. In this respect, when a cationic solution is directly contacted with the surface of the resist pattern 120, a cationic silicate oligomer or a cationic polymer is selectively attached to the surface of the resist pattern 120 in a self-assembled manner. As a result, the first self-assembled molecular monolayer 132 made of the cationic silicate oligomer or the cationic polymer is formed on the surface of the resist pattern 120.

Next, as needed, rinsing may be performed, as described above with reference to operation 20-1b of FIG. 2 or operation 20-2b of FIG. 3.

The thickness of the first self-assembled molecular monolayer 132 varies with the type of the polymer constituting the first self-assembled molecular monolayer 132. When the second width d2 is a desired value, the operation of forming a mask pattern is terminated. At this time, when the first self-assembled molecular monolayer 132 has been formed using the aqueous cationic silicate oligomer solution, the substrate 100 is baked to complete the sol-gel reaction, as described above with reference to operation 20-1$d$ of FIG. 2 or operation 20-2$d$ of FIG. 3.

Figure 4C:
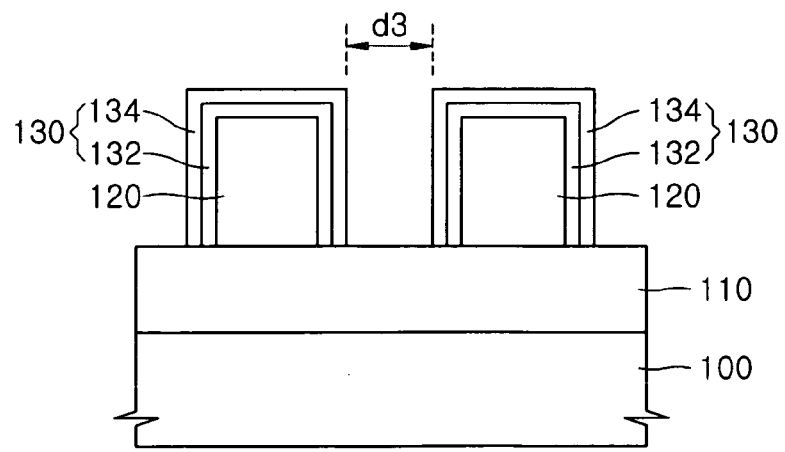

In FIG. 4C, when the second width d2 is not a desired value or when a smaller width is desired, an aqueous anionic silicate oligomer solution or an anionic polymer electrolyte solution containing an anionic polymer is contacted with a surface of the first self-assembled molecular monolayer 132 to form a second self-assembled molecular monolayer 134. By the second self-assembled molecular monolayer 134, the upper surface of the underlayer 110 is exposed to a third width d3 which is smaller than the second width d2.

As needed, the resultant structure containing the second self-assembled molecular monolayer 134 is rinsed, as described above with reference to operation 20-1$g$ of FIG. 2 or operation 20-2$g$ of FIG. 3.

The thickness of the second self-assembled molecular monolayer 134 varies according to the type of the polymer constituting the second self-assembled molecular monolayer 134. When a self-assembled molecular layer 130 including the first self-assembled molecular monolayer 132 and the second self-assembled molecular monolayer 134 has a predetermined thickness so that the third width d3 reaches a desired dimension, the operations of forming the self-assembled molecular monolayers are terminated. Here, the exposed areas of the underlayer 110 are defined by the self-assembled molecular layer 130 formed on the sidewall surface of the resist pattern 120.

When the thickness of the self-assembled molecular layer 130 is less than a predetermined value, the operations of forming the first self-assembled molecular monolayer 132 and the second self-assembled molecular monolayer 134 as described above with reference to FIGS. 4B and 4C are alternately repeated several times to expose the upper surface of the underlayer 110 to a desired width.

Figure 4D:
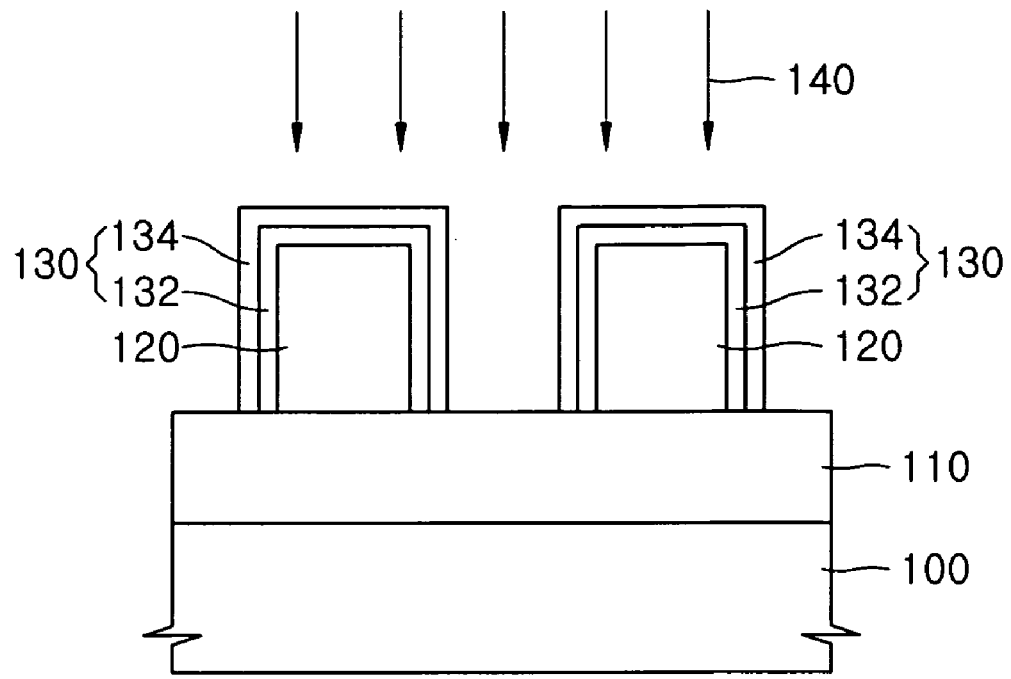

In FIG. 4D, the substrate 100 is baked using a heat 140 to complete the sol-gel reaction, as described above with reference to operation 20-1$d$ of FIG. 2 or operation 20-2$d$ of FIG. 3. Preferably, the baking is performed at a temperature of from about 100 to about 180° C.

Figure 5A:
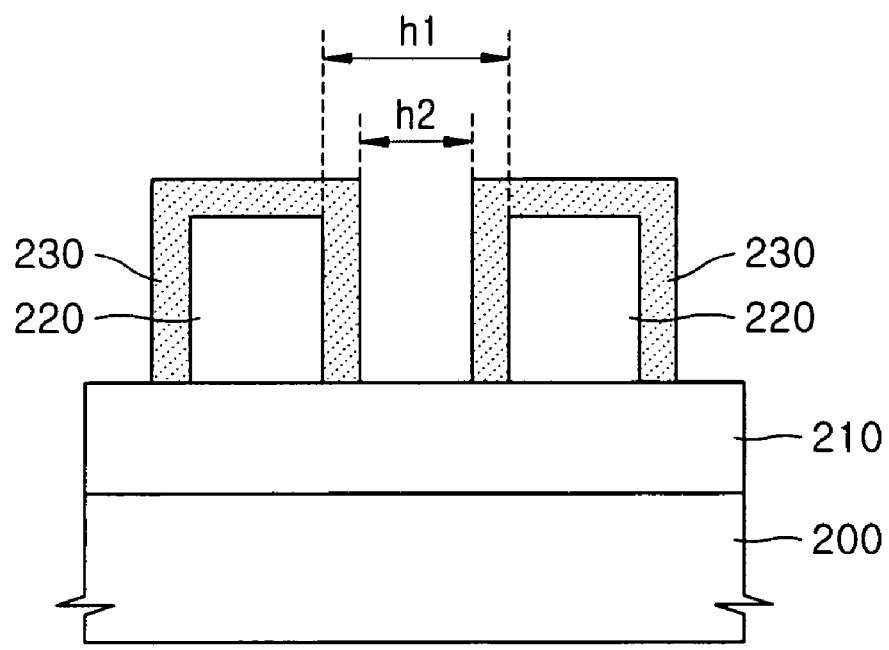
FIGS. 5A through 5C are sequential sectional views that illustrate a method of fabricating a semiconductor device according to a first embodiment of the present invention.
Figure 5B:
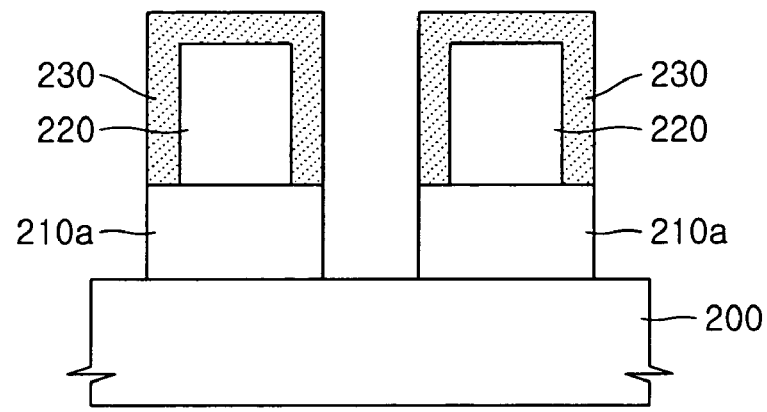
Figure 5C:
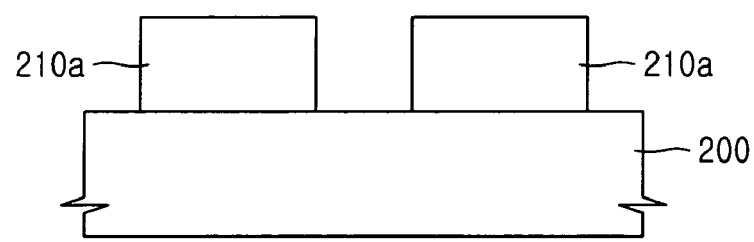

FIGS. 5A through 5C are sequential sectional views that illustrate a method of fabricating a semiconductor device according to a first embodiment of the present invention Referring to FIG. 5A, an underlayer 210 to be etched to form a predetermined pattern, for example contact holes or trenches, is formed on a semiconductor substrate 200. For example, the underlayer 210 may be a dielectric film, a conductive film, or a semiconductive film.

Next, as described above with reference to FIG. 4A, a resist pattern 220 is formed on the underlayer 210. The resist pattern 220 is formed with openings through which an upper surface of the underlayer 210 is exposed to a first width h1.

Next, as described above with reference to FIGS. 4B and 4D, a self-assembled molecular layer 230 is selectively formed on a surface of the resist pattern 220. For example, the self-assembled molecular layer 230 may be composed of a single self-assembled molecular monolayer having a silica network formed by sol-gel reaction of a cationic silicate oligomer. Alternatively, the self-assembled molecular layer 230 may have an alternately stacked structure of one or more of first self-assembled molecular monolayers containing a cationic polymer and one or more of second self-assembled molecular monolayers having a silica network formed by sol-gel reaction of an anionic silicate oligomer. In addition, the self-assembled molecular layer 230 may have a silica network formed by sol-gel reaction of an alternately stacked structure in one or more of the first self-assembled molecular monolayers made of a cationic silicate oligomer and one or more of the second self-assembled molecular monolayers made of an anionic silicate oligomer. By the self-assembled molecular layer 230, the upper surface of the underlayer 210 is exposed to a second width h2, which is smaller than the first width h1.

In FIG. 5B, the underlayer 210 is dry-etched by using a mask pattern composed of the resist pattern 220 and the self-assembled molecular layer 230 as an etching mask to form an underlayer pattern 210$a$. Then, the mask pattern composed of the resist pattern 220 and the self-assembled molecular layer 230 is removed, as shown in FIG. 5C.

In the semiconductor device fabrication method according to the first embodiment of the present invention, a self-assembled molecular monolayer can be repeatedly formed on the surface of a resist pattern, which makes it possible to reduce the width of openings of a mask pattern to a desired dimension. In the reduction of the width of the openings, the self-assembled molecular monolayer is selectively formed only on the surface of the resist pattern in a self-assembled manner. As a result, a vertical sidewall profile of the mask pattern can remain unchanged. Furthermore, since a silicon-containing self-assembled molecular layer is used as a mask pattern in etching an underlayer, a resistance to dry etching can be sufficiently ensured.

FIGS. 6A through 6F are sequential sectional views that illustrate a method of fabricating a semiconductor device according to a second embodiment of the present invention. The semiconductor device fabrication method according to the second embodiment of the present invention involves a patterning process using BLR technology.

Figure 6A:
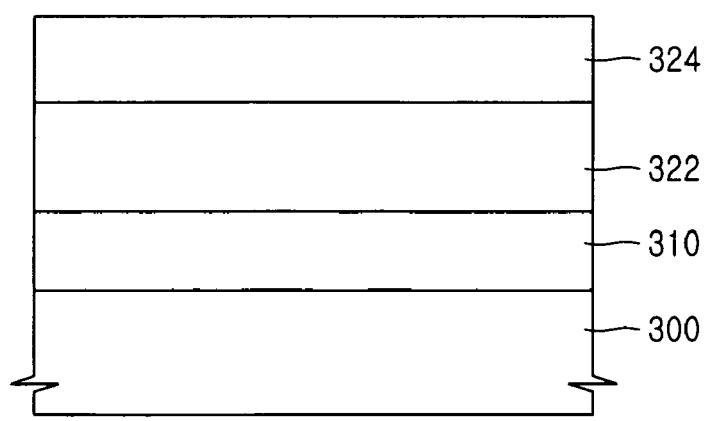
FIGS. 6A through 6F are sequential sectional views that illustrate a method of fabricating a semiconductor device according to a second embodiment of the present invention.

In FIG. 6A, an underlayer 310 to be etched to form contact holes or trenches is formed on a semiconductor substrate 300. For example, the underlayer 310 may be a dielectric film, a conductive film, or a semiconductive film.

Next, a bottom layer resist film 322 is formed on the underlayer 310. For example, the bottom layer resist film 322 is an organic hard mask made of poly(arylene ether) or amorphous carbon.

A resist composition is spin-coated on the bottom layer resist film 322 to form a top layer resist film 324. The resist composition used to form the top layer resist film 324 may be a silicon-containing resist composition or a silicon-free resist composition.

Figure 6B:
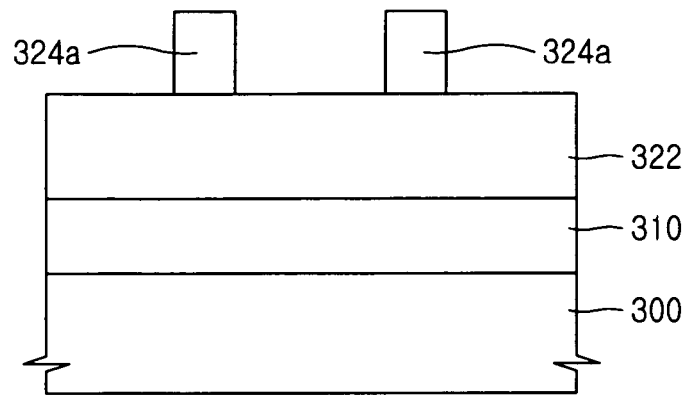

In FIG. 6B, the top layer resist film 324 is subjected to exposure and development to form a top layer resist pattern 324$a$.

Figure 6C:
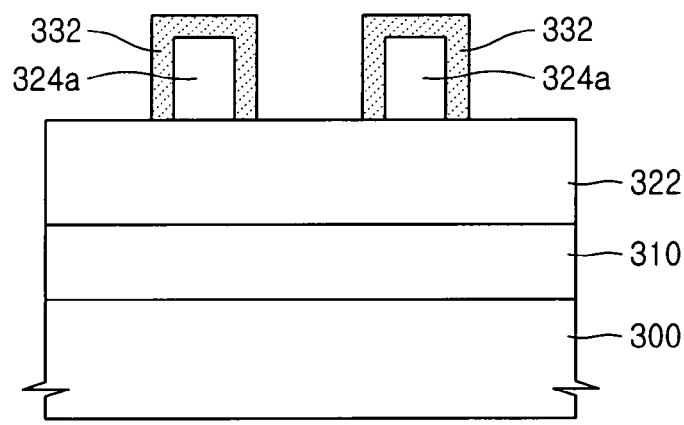

In FIG. 6C, as described above with reference to FIG. 5A, a silicon-containing self-assembled molecular layer 332 is formed on the top layer resist pattern 324$a$.

Figure 6D:
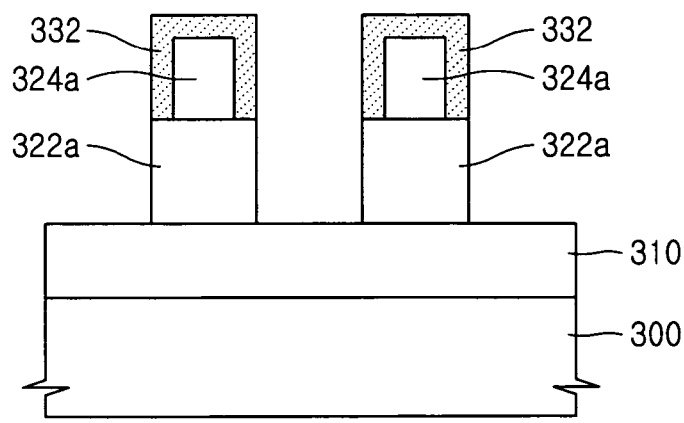

In FIG. 6D, the bottom layer resist film 322 is dry-etched using a mask pattern composed of the top layer resist pattern 324$a$ and the self-assembled molecular layer 332 as an etching mask to form a bottom layer resist pattern 322$a$. At this time, portions of the top layer resist pattern 324$a$ and the self-assembled molecular layer 332 may be consumed.

Figure 6E:
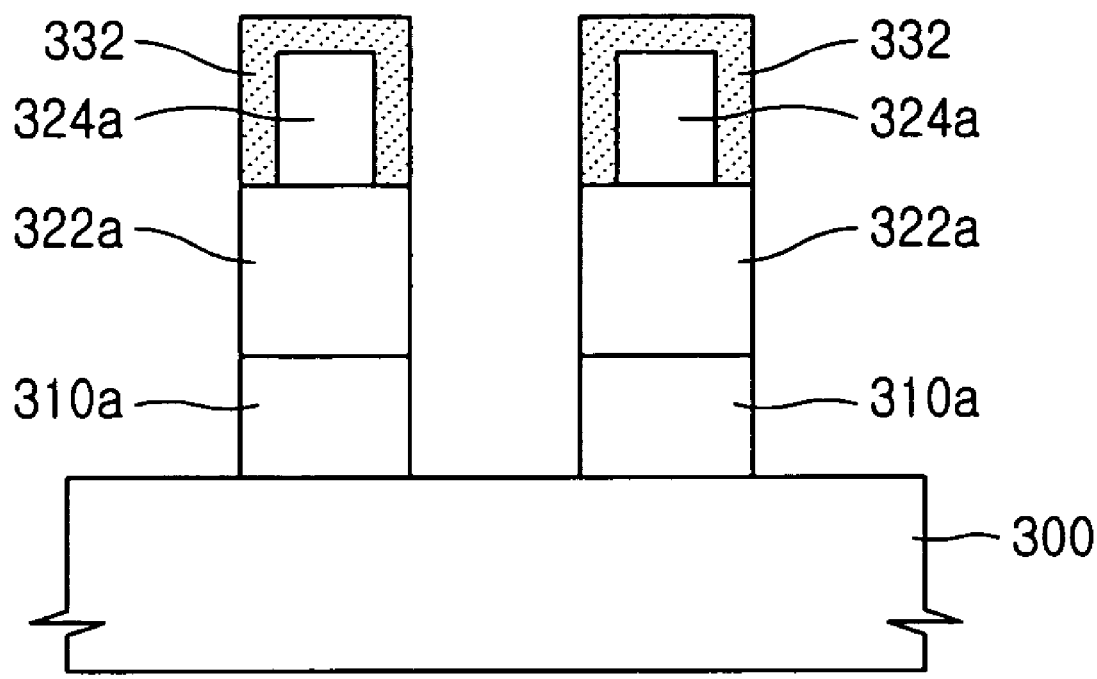

In FIG. 6E, the underlayer 310 is dry-etched using the mask pattern composed of the top layer resist pattern 324$a$ and the self-assembled molecular layer 332 and the underlying bottom layer resist pattern 322$a$ as an etching mask to form an underlayer pattern 310$a$.

Figure 6F:
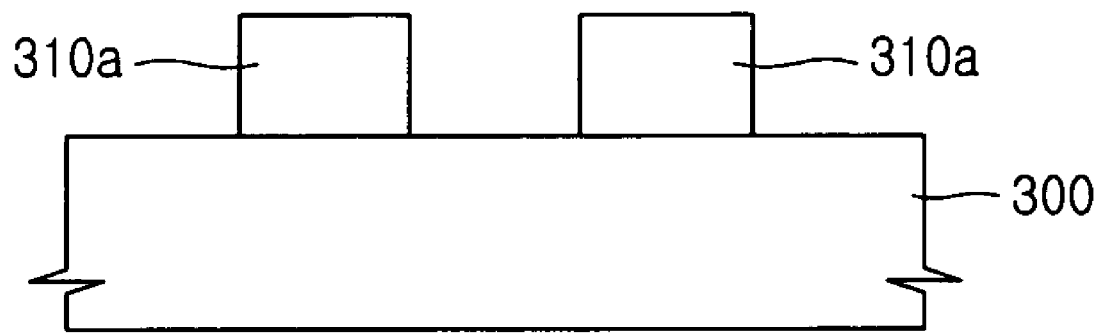

In FIG. 6F, the mask pattern composed of the top layer resist pattern 324a and the self-assembled molecular layer 332 and the bottom layer resist pattern 322a are removed.

As described above in the second embodiment of the present invention for semiconductor device fabrication, in the patterning process using BLR, the bottom layer resist film 322 is etched by using the self-assembled molecular layer 332 made of a silicon-containing material such as a cationic or anionic silicate oligomer as a mask pattern. Therefore, the silicon content of an etching mask increases, thereby ensuring a sufficient resistance to dry etching.

The second embodiment of the present invention for semiconductor device fabrication has been described in view of the patterning process using BLR but the present invention is not limited thereto. That is, it will be understood by those of ordinary skill in the art that a MLR process in which the underlayer 310 is patterned after forming an interlayer oxide film between the bottom layer resist film 322 and the top layer resist film 324 is also within the spirit and scope of the present invention.

Hereinafter, illustrative examples of mask patterns formed according to a mask pattern formation method for semiconductor device fabrication of the embodiments of the present invention will be described. The embodiments of present invention will be described more specifically by Examples. However, the following Examples are provided to illustrate the invention, and thus the present invention is not limited to or by them.

EXAMPLE 1

An organic antireflection film (DUV-30, Nissan Chemical Industries, Ltd.) was formed to a thickness of 36 nm on a bare silicon wafer and a photoresist (SAIL-G24c, ShinEtsu Chemical Co. Ltd.) was coated thereon to form a resist film with a thickness of 240 nm. The wafer, on which the resist film was formed, was subjected to soft baking, followed by exposure with ArF (193 nm) stepper (ASML 1100) specified with numeric aperture (NA) of 0.75 (annular illumination: 0.85-0.55) and 23 mJ/cm$^2$ exposure light energy, and post-exposure baking (PEB). Then, the wafer was developed with a 2.38 wt % tetramethylammonium hydroxide (TMAH) solution to form, on the wafer, a resist pattern with openings defining a hole pattern with CD (critical dimension) of 112.9 nm.

20 ml of a cationic polymer electrolyte solution containing 1% poly(diallyldimethylammonium chloride) was poured onto the resist pattern and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern with openings defining a hole pattern with smaller CD of 107.6 nm.

EXAMPLE 2

20 ml of a cationic polymer electrolyte solution containing 1% poly(diallyldimethylammonium chloride) was poured onto the mask pattern obtained in Example 1 and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water.

20 ml of a cationic polymer electrolyte solution containing 1% poly(diallyldimethylammonium chloride) was poured onto the mask pattern and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern with openings defining a hole pattern with a smaller CD of 89.1 nm.

EXAMPLE 3

20 ml of a cationic polymer electrolyte solution containing 1% poly(diallyldimethylammonium chloride) was poured onto the mask pattern obtained in Example 2 and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern with openings defining a hole pattern with smaller CD of 81.8 nm.

The mask pattern thus obtained was cured by baking at 150° C. for 60 seconds to complete a sol-gel reaction.

EXAMPLE 4

An organic antireflection film (AR46, Shipley Co. Ltd.) was formed to a thickness of 29 nm on a bare silicon wafer and a photoresist (RHR, ShinEtsu Chemical Co. Ltd) was coated thereon to form a resist film with a thickness of 240 nm. The wafer, on which the resist film was formed, was subjected to soft baking, followed by exposure with ArF (193 nm) stepper (ASML 1100) specified with NA of 0.75 (annular illumination: 0.85-0.55) and 31 mJ/cm$^2$ exposure light energy, and PEB. Then, the wafer was developed with a 2.38 wt % TMAH solution to form, on the wafer, a resist pattern with openings defining a hole pattern with CD of 116.4 nm.

20 ml of a cationic polymer electrolyte solution containing 1% poly(diallyldimethylammonium chloride) was poured onto the resist pattern and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern with openings defining a hole pattern with a smaller CD of 111.4 nm.

20 ml of a cationic polymer electrolyte solution containing 1% poly(diallyldimethylammonium chloride) was poured onto the mask pattern and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern with openings defining a hole pattern with a smaller CD of 102.0 nm.

20 ml of a cationic polymer electrolyte solution containing 1% poly(diallyldimethylammonium chloride) was poured onto the mask pattern and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern with openings defining a hole pattern with a smaller CD of 96.0 nm.

The mask pattern thus obtained was cured by baking at 160° C. for 60 seconds to complete a sol-gel reaction.

EXAMPLE 5

An organic antireflection film (US803, JSR Micro, Co. Ltd) was formed to a thickness of 320 nm on a bare silicon wafer and a photoresist (RHR, ShinEtsu Chemical Co. Ltd) was coated thereon to form a resist film with a thickness of 180 nm. The wafer, on which the resist film was formed, was subjected to soft baking, followed by exposure with ArF (193 nm) stepper (Nikon S306C) specified with NA of 0.78 (annular illumination: 0.92-0.70) and 31 mJ/cm$^2$ exposure light energy, and PEB. Then, the wafer was developed with a 2.38 wt % TMAH solution to form, on the wafer, a resist pattern in the form of a line and space pattern with a linewidth CD of 81.7 nm.

20 ml of a cationic polymer electrolyte solution containing 1% poly(diallyldimethylammonium chloride) was poured onto the resist pattern and puddled for 30 seconds. Then, the wafer was rinsed with deionized water.

20 ml of an aqueous anionic silicate oligomer solution prepared from 5% tetraethyl orthosilicate and 0.48% TMAH was poured onto the wafer and puddled for 30 seconds. Then, the wafer was rinsed with deionized water to obtain a mask pattern in the form of a line and space pattern with a linewidth CD of 82.9 nm.

EXAMPLE 6

20 ml of a cationic polymer electrolyte solution containing 1% poly(diallyldimethylammonium chloride) was poured onto the mask pattern obtained in Example 5 and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern in the form of a line and space pattern with a linewidth CD of 86.4 nm.

20 ml of a cationic polymer electrolyte solution containing 1% poly(diallyldimethylammonium chloride) was poured onto the mask pattern and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern in the form of a line and space pattern with a linewidth CD of 96.7 nm.

20 ml of a cationic polymer electrolyte solution containing 1% poly(diallyldimethylammonium chloride) was poured onto the mask pattern and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern in the form of a line and space pattern with a linewidth CD of 103.7 nm.

20 ml of a cationic polymer electrolyte solution containing 1% poly(diallyldimethylammonium chloride) was poured onto the mask pattern and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern in the form of a line and space pattern with a linewidth CD of 114.9 nm.

The mask pattern thus obtained was cured by baking at 160° C. for 60 seconds to complete a sol-gel reaction.

EXAMPLE 7

An organic antireflection film (DUV-30, Nissan Chemical Industries, Ltd.) was formed to a thickness of 29 nm on a bare silicon wafer and a photoresist (SAIL-G24c, ShinEtsu Chemical Co. Ltd) was coated thereon to form a resist film with a thickness of 240 nm. The wafer, on which the resist film was formed, was subjected to soft baking, followed by exposure with ArF (193 nm) stepper (ASML 1100) specified with NA of 0.75 (annular illumination: 0.85-0.55) and 23 mJ/cm$^2$ exposure light energy, and PEB. Then, the wafer was developed with a 2.38 wt % TMAH solution to form, on the wafer, a resist pattern with openings defining a hole pattern with a CD of 112.9 nm.

20 ml of an aqueous cationic silicate oligomer solution containing 1% aminopropyltrimethoxysilane that had been hydrolyzed and oligomerized for two days was poured onto the resist pattern and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern with openings defining a hole pattern with a CD of 105.3 nm.

20 ml of an aqueous cationic silicate oligomer solution containing 1% aminopropyltrimethoxysilane that had been hydrolyzed and oligomerized for two days was poured onto the mask pattern and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern with openings defining a hole pattern with a CD of 97.8 nm.

20 ml of an aqueous cationic silicate oligomer solution containing 1% aminopropyltrimethoxysilane that had been hydrolyzed and oligomerized for two days was poured onto the mask pattern and puddled for 30 seconds. Then, the wafer was rinsed with deionized water.

20 ml of an aqueous anionic silicate oligomer solution prepared from 1% tetraethyl orthosilicate and 60 ppm sodium hydroxide was poured onto the wafer and puddled for 30 seconds. Then, the wafer was rinsed with deionized water to obtain a mask pattern with openings defining a hole pattern with a CD of 90.3 nm.

EXAMPLE 8

An organic antireflection film (US803, JSR Micro, Co. Ltd) was formed to a thickness of 320 nm on a bare silicon wafer and a photoresist (RHR, ShinEtsu Chemical Co. Ltd) was coated thereon to form a resist film with a thickness of 180 nm. The wafer, on which the resist film was formed, was subjected to soft baking, followed by exposure with ArF (193 nm) stepper (Nikon S306C) specified with NA of 0.78 (annular illumination: 0.92-0.70) and 31 mJ/cm$^2$ exposure light energy, and PEB. Then, the wafer was developed with a 2.38 wt % TMAH solution to form, on the wafer, a resist pattern in the form of a line and space pattern with a linewidth CD of 81.7 nm.

20 ml of a cationic polymer electrolyte solution containing 1% poly(allylamine hydrochloride) was poured onto the resist pattern and puddled for 30 seconds. Then, the wafer was rinsed with deionized water.

20 ml of an aqueous tetramethyl ammonium silicate ($TMAH2SiO_2$) solution used as an aqueous anionic silicate oligomer solution was poured onto the resist pattern and puddled for 30 seconds. Then, the wafer was rinsed with deionized water to obtain a mask pattern in the form of a line and space pattern with a linewidth CD of 85.3 nm.

20 ml of a cationic polymer electrolyte solution containing 1% poly(allylamine hydrochloride) was poured onto the mask pattern and puddled for 30 seconds. Then, the wafer was rinsed with deionized water.

20 ml of an aqueous $TMAH2SiO_2$ solution used as an aqueous anionic silicate oligomer solution was poured onto the wafer and puddled for 30 seconds. Then, the wafer was rinsed with deionized water to obtain a mask pattern in the form of a line and space pattern with a linewidth CD of 88.1 nm.

20 ml of a cationic polymer electrolyte solution containing 1% poly(allylamine hydrochloride) was poured onto the mask pattern and puddled for 30 seconds. Then, the wafer was rinsed with deionized water.

20 ml of an aqueous $TMAH2SiO_2$ solution used as an aqueous anionic silicate oligomer solution was poured onto the wafer and puddled for 30 seconds. Then, the wafer was rinsed with deionized water to obtain a mask pattern in the form of a line and space pattern with a linewidth CD of 90.7 nm.

20 ml of a cationic polymer electrolyte solution containing 1% poly(allylamine hydrochloride) was poured onto the mask pattern and puddled for 30 seconds. Then, the wafer was rinsed with deionized water.

20 ml of an aqueous $TMAH2SiO_2$ solution used as an aqueous anionic silicate oligomer solution was poured onto the mask pattern and puddled for 30 seconds. Then, the wafer was rinsed with deionized water to obtain a mask pattern in the form of a line and space pattern with a linewidth CD of 93.2 nm According to an embodiment of the present invention, a silicon-containing self-assembled molecular layer is formed on a resist pattern to obtain a mask pattern with microdimensional openings above the wavelength limit established by photolithography. In an embodiment of the present invention, a self-assembled molecular monolayer can be repeatedly formed on the surface of the resist pattern, which makes it possible to reduce the CD of openings of the mask pattern used as an etching mask to a desired level. In the reduction of the CD of the openings, the self-assembled molecular monolayer is selectively formed only on the surface of the resist pattern in a self-assembled manner. As a result, a vertical sidewall profile of the mask pattern can remain unchanged. Furthermore, an embodiment of the present invention provides a simple and inexpensive process since the CD of the openings can be reduced by a simple method at room temperature, unlike a conventional thermal treatment technology. Moreover, an embodiment of the present invention provides a resistance to dry etching since an underlayer is etched using a silicon-containing self-assembled molecular layer as a mask pattern.

In addition, since the self-assembled molecular layer is formed on the top layer resist pattern using a coating composition having silicon-containing material such as a cationic or anionic silicate oligomer by BLR or MLR technology, the resulting mask pattern including the top layer resist pattern has a high silicon content, thereby enhancing the resistance to dry etching for fine pattern formation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A mask pattern for semiconductor device fabrication, comprising:
    a resist pattern formed on a semiconductor substrate; and
    a silicon-containing self-assembled molecular layer surrounding the resist pattern, wherein the self-assembled molecular layer comprises a sol-gel product of at least one oligomer selected from a cationic silicate oligomer and an anionic silicate oligomer.

2. The mask pattern of claim 1, wherein the self-assembled molecular layer has a silica network.

3. The mask pattern of claim 2, wherein the self-assembled molecular layer further comprises at least one polymer selected from a cationic polymer and an anionic polymer.

4. The mask pattern of claim 3, wherein the cationic polymer is at least one compound selected from the group consisting of polyethyleneimine derivatives, polyallylamine derivatives, poly(diallyldimethylammonium chloride) derivatives, amino group-containing cellulose, cationized cellulose, poly(acrylamide), polyvinylpyridine, and poly (choline acrylate).

5. The mask pattern of claim 3, wherein the anionic polymer is at least one compound-selected from the group consisting of poly(acrylic acid), polystyrenesulfonate, carboxyl group-containing cellulose, anionized cellulose, poly(sulfonalkyl acrylate), poly(acrylamido alkyl sulfonate), and poly(vinyl sulfate).

6. The mask pattern of claim 1, wherein the cationic silicate oligomer is a hydrolyzed product of at least one compound selected from aminopropyltrimethoxysilane, aminopropyltriethoxysilane, and amino group-containing polyhedral oligomeric silsesquioxane.

7. The mask pattern of claim 1, wherein the anionic silicate oligomer is one of a hydrolyzed product of at least one compound selected from silica, tetraethyl orthosilicate, and monoalkyl-trialkoxy silicon; and tetramethyl ammonium silicate ($TMAH2SiO_2$).

8. The mask pattern of claim 1, wherein the self-assembled molecular layer is a single layer made of a sol-gel product of a cationic silicate oligomer.

9. The mask pattern of claim 1, wherein the self-assembled molecular layer has a stacked structure of:
    a first self-assembled molecular monolayer made of a sol-gel product of a cationic silicate oligomer; and
    a second self-assembled molecular monolayer made of one compound selected from a sol-gel product of an anionic silicate oligomer and an anionic polymer.

10. The mask pattern of claim 9, wherein the self-assembled molecular layer has a stacked structure is obtained by alternately and repeatedly stacking the first self-assembled molecular monolayer and the second self-assembled molecular monolayer.

11. The mask pattern of claim 1, wherein the self-assembled molecular layer has a stacked structure of:
   a first self-assembled molecular monolayer made of a compound selected from a sol-gel product of a cationic silicate oligomer and a cationic polymer; and
   a second self-assembled molecular monolayer made of a sol-gel product of an anionic silicate oligomer.

12. The mask pattern of claim 11, wherein the self-assembled molecular layer has a stacked structure is obtained by alternately and repeatedly stacking the first self-assembled molecular monolayer and the second self-assembled molecular monolayer.

13. The mask pattern of claim 1, wherein the resist pattern is formed using one of
   a material comprising a Novolak resin and a DNQ (diazonaphthoquinone)-based compound;
   a chemical-amplification type resist composition comprising a photo-acid generator (PAG); a resist composition for KrF excimer laser (248 nm), ArF excimer laser (193 nm), or $F_2$ excimer laser (157 nm); and
   a silicon-containing resist composition.

14. The mask pattern of claim 1, wherein the resist pattern is formed on an underlayer, a portion of the underlayer is exposed through openings of the resist pattern, and
   the self-assembled molecular layer is formed on a sidewall of the resist pattern defining the openings to defines an exposed area of the underlayer.

15. The mask pattern of claim 14, wherein the underlayer is a dielectric film, a conductive film, or a semiconductive film.

16. The mask pattern of claim 14, wherein the underlayer is formed using a resist composition.

17. The mask pattern of claim 1, wherein the resist pattern is formed with one of
   a plurality of openings to define a hole pattern; and
   a plurality of lines to define a line and space pattern.

* * * * *